US012414333B2

(12) United States Patent
Kaneko et al.

(10) Patent No.: US 12,414,333 B2
(45) Date of Patent: Sep. 9, 2025

(54) SEMICONDUCTOR DEVICE (71) Applicant: Magnolia White Corporation, Tokyo (JP)

(72) Inventors: Toshiki Kaneko, Tokyo (JP); Akihiro Hanada, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 477 days.

(21) Appl. No.: 17/862,419

(22) Filed: Jul. 12, 2022

(65) Prior Publication Data

US 2023/0017598 A1    Jan. 19, 2023

(30) Foreign Application Priority Data

Jul. 13, 2021  (JP) ................... 2021-115890

(51) Int. Cl.
*H10D 30/67*      (2025.01)

(52) U.S. Cl.
CPC ..... *H10D 30/6755* (2025.01); *H10D 30/6729* (2025.01)

(58) Field of Classification Search
CPC .......... H10D 30/6729; H10D 30/6755; H10D 30/6759; H10D 30/6758; H10D 30/6757; H10D 30/6756; H10D 30/674; H10D 30/6741; H10D 30/6743; H10D 30/6748; H10D 30/675
USPC ....................................................... 257/211
See application file for complete search history.

(56) References Cited

U.S. PATENT DOCUMENTS

| | | | |
|---|---|---|---|
| 6,284,576 B1* | 9/2001 | Ban | H01L 29/66765 257/E21.414 |
| 9,252,279 B2* | 2/2016 | Watanabe | H01L 29/78606 |
| 2016/0190330 A1* | 6/2016 | Yamazaki | H01L 29/04 257/43 |
| 2017/0278872 A1 | 9/2017 | Ohara | |
| 2018/0122842 A1* | 5/2018 | Saitoh | G01T 1/20 |
| 2020/0259020 A1 | 8/2020 | Watakabe et al. | |

FOREIGN PATENT DOCUMENTS

JP    2017-183312 A    10/2017
JP    2020-129635 A     8/2020

* cited by examiner

*Primary Examiner* — Monica D Harrison
(74) *Attorney, Agent, or Firm* — XSENSUS LLP (57) ABSTRACT

According to one embodiment, a semiconductor device includes a gate electrode, a first insulating layer covering the gate electrode, an oxide semiconductor provided on the first insulating layer immediately above the gate electrode, a source electrode in contact with the oxide semiconductor, and a drain electrode in contact with the oxide semiconductor. Each of the source electrode and the drain electrode includes an oxide conductive layer in contact with the oxide semiconductor, a first metal layer stacked on the oxide conductive layer, a second metal layer formed of a different material from the first metal layer and stacked on the first metal layer, and a third metal layer formed of a same material as the first metal layer and stacked on the second metal layer.

9 Claims, 7 Drawing Sheets

SEMICONDUCTOR DEVICE

CROSS-REFERENCE TO RELATED APPLICATIONS

This application is based upon and claims the benefit of priority from Japanese Patent Application No. 2021-115890, filed Jul. 13, 2021, the entire contents of which are incorporated herein by reference.

FIELD

Embodiments described herein relate generally to a semiconductor device.

BACKGROUND

In liquid crystal display devices, a technique has been suggested as follows. In the technique, a transistor comprising an oxide semiconductor is provided in the pixel circuit of a display area, and further, a transistor comprising a silicon semiconductor is provided in the drive circuit of a peripheral area.

DETAILED DESCRIPTION

In general, according to one embodiment, a semiconductor device comprises an insulating substrate, a gate electrode provided on the insulating substrate, a first insulating layer which covers the gate electrode, an oxide semiconductor provided on the first insulating layer immediately above the gate electrode, a source electrode which is in contact with the oxide semiconductor, and a drain electrode which is in contact with the oxide semiconductor. Each of the source electrode and the drain electrode comprises an oxide conductive layer which is in contact with the oxide semiconductor, a first metal layer stacked on the oxide conductive layer, a second metal layer formed of a different material from the first metal layer and stacked on the first metal layer, and a third metal layer formed of a same material as the first metal layer and stacked on the second metal layer.

According to another embodiment, a semiconductor device comprises an insulating substrate, a gate electrode provided on the insulating substrate, a first insulating layer which covers the gate electrode, an oxide semiconductor provided on the first insulating layer immediately above the gate electrode, a source electrode which is in contact with the oxide semiconductor, a drain electrode which is in contact with the oxide semiconductor, a passivation film which covers the source electrode and the drain electrode, and a top gate electrode provided on the passivation film and electrically connected to the gate electrode immediately above the gate electrode. Each of the gate electrode, the source electrode, the drain electrode and the top gate electrode comprises a first metal layer containing molybdenum (Mo), a second metal layer containing aluminum (Al) and stacked on the first metal layer, and a third metal layer containing molybdenum (Mo) and stacked on the second metal layer.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. The plane defined by the X-axis and the Y-axis is referred to as an X-Y plane. When the X-Y plane is viewed, the appearance is defined as a plan view.

The semiconductor device of the present embodiment may be applied to various types of display devices such as a liquid crystal display device, an organic electroluminescent display device, an electrophoretic display device and an LED display device, various types of sensors such as a capacitive sensor and an optical sensor, and an electronic device such as an illumination device.

Figure 1:
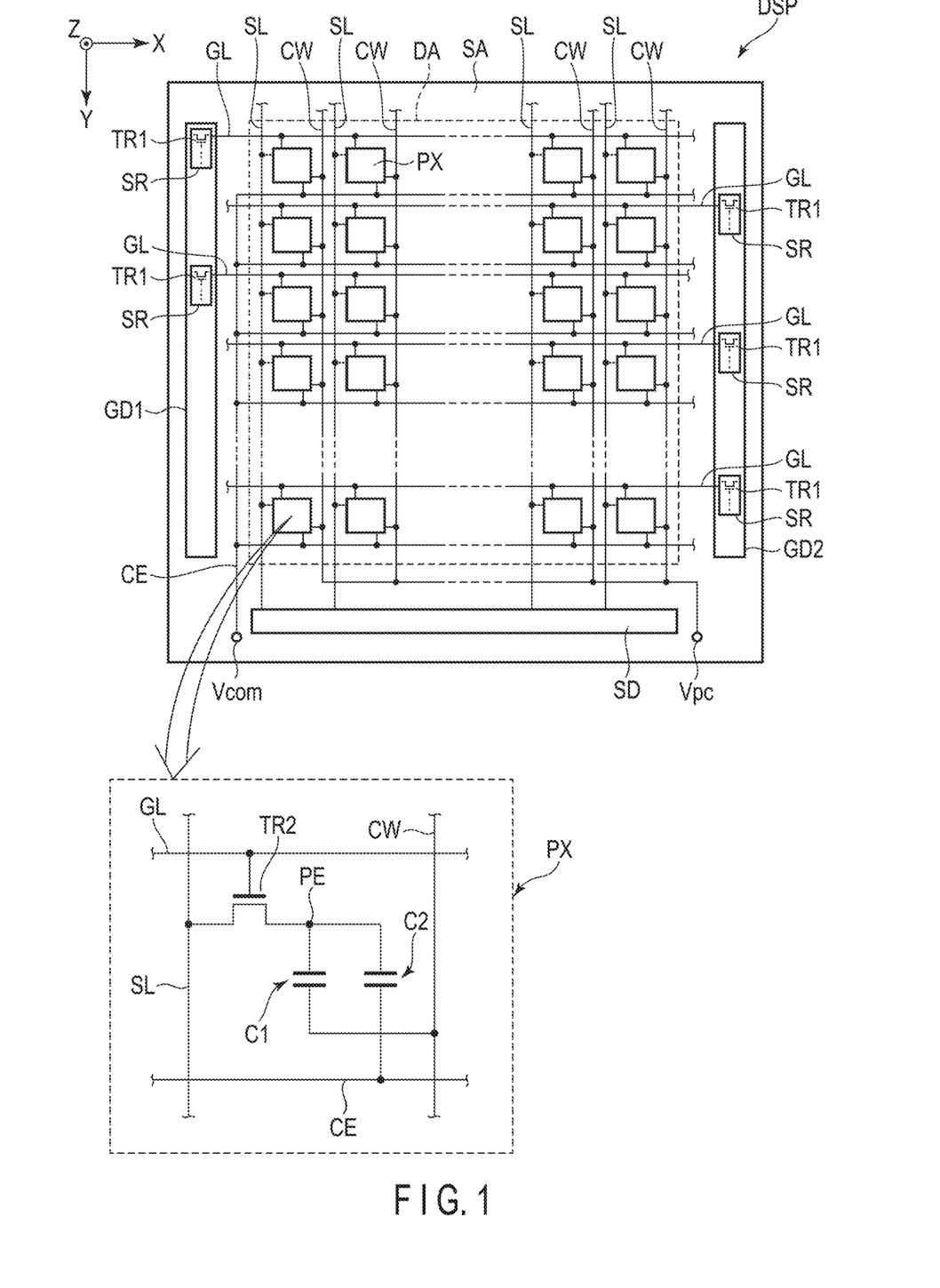
FIG. 1 is a plan view showing the configuration of a display device DSP which is an example of a semiconductor device.

FIG. 1 is a plan view showing the configuration of a display device DSP which is an example of a semiconductor device.

The display device DSP comprises a display area DA which displays an image, and a peripheral area (non-display area) SA around the display area DA. In the example shown in FIG. 1, the peripheral area SA is formed in a frame shape surrounding the display area DA.

In the peripheral area SA, the display device DSP comprises gate drivers GD1 and GD2, and a source driver SD. Each of the gate drivers GD1 and GD2 comprises a plurality of shift registers SR. Each shift register SR comprises a first transistor TR1. Thus, the gate drivers GD1 and GD2 are formed on the same substrate with the elements of the display area DA.

In the display area DA, the display device DSP comprises a plurality of pixels PX, a plurality of gate lines GL, a plurality of source lines SL, a plurality of capacitive lines CW and a common electrode CE. The pixels PX are arranged in matrix in a first direction X and a second direction Y.

The gate lines GL extend in the first direction X and are arranged in the second direction Y at intervals. Each gate line GL is electrically connected to the gate driver GD1 or GD2. For example, the odd-numbered gate lines GL are connected to the shift registers SR of the gate driver GD1. The even-numbered gate lines GL are connected to the shift registers SR of the gate driver GD2. Each gate driver GL is driven by the gate driver GD1 or GD2.

The source lines SL extend in the second direction Y and are arranged in the first direction X at intervals. In the display area DA, the source lines SL intersect the gate lines GL. The source lines SL are electrically connected to the source driver SD. Each source line SL is driven by the source driver SD.

The capacitive lines CW extend in the first direction X or the second direction Y. For example, in the peripheral area SA, the capacitive lines CW are connected to a voltage application unit Vpc to which predetermined voltage is applied.

The common electrode CE is provided over a plurality of pixels PX. The common electrode CE is connected to a voltage application unit Vcom to which predetermined voltage is applied.

As shown in the enlarged view in FIG. 1, each pixel PX comprises a second transistor TR2 and a pixel electrode PE. As described later, each of the first transistor TR1 and the second transistor TR2 is formed by, for example, a thin-film transistor (TFT). The second transistor TR2 is electrically connected to the gate line GL and the source line SL. The gate line GL is electrically connected to the second transistor TR2 in each of the pixels PX arranged in the first direction X. The source line SL is electrically connected to the second transistor TR2 in each of the pixels PX arranged in the second direction Y.

The pixel electrode PE is electrically connected to the second transistor TR2. The pixel electrode PE faces the common electrode CE. Capacitance C1 is formed between the pixel electrode PE and the capacitive line CW. Capacitance C2 is formed between the common electrode CE and the pixel electrode PE.

Now, this specification explains the transistor TR which can be applied to at least one of the first transistor TR1 and the second transistor TR2.

Figure 2:
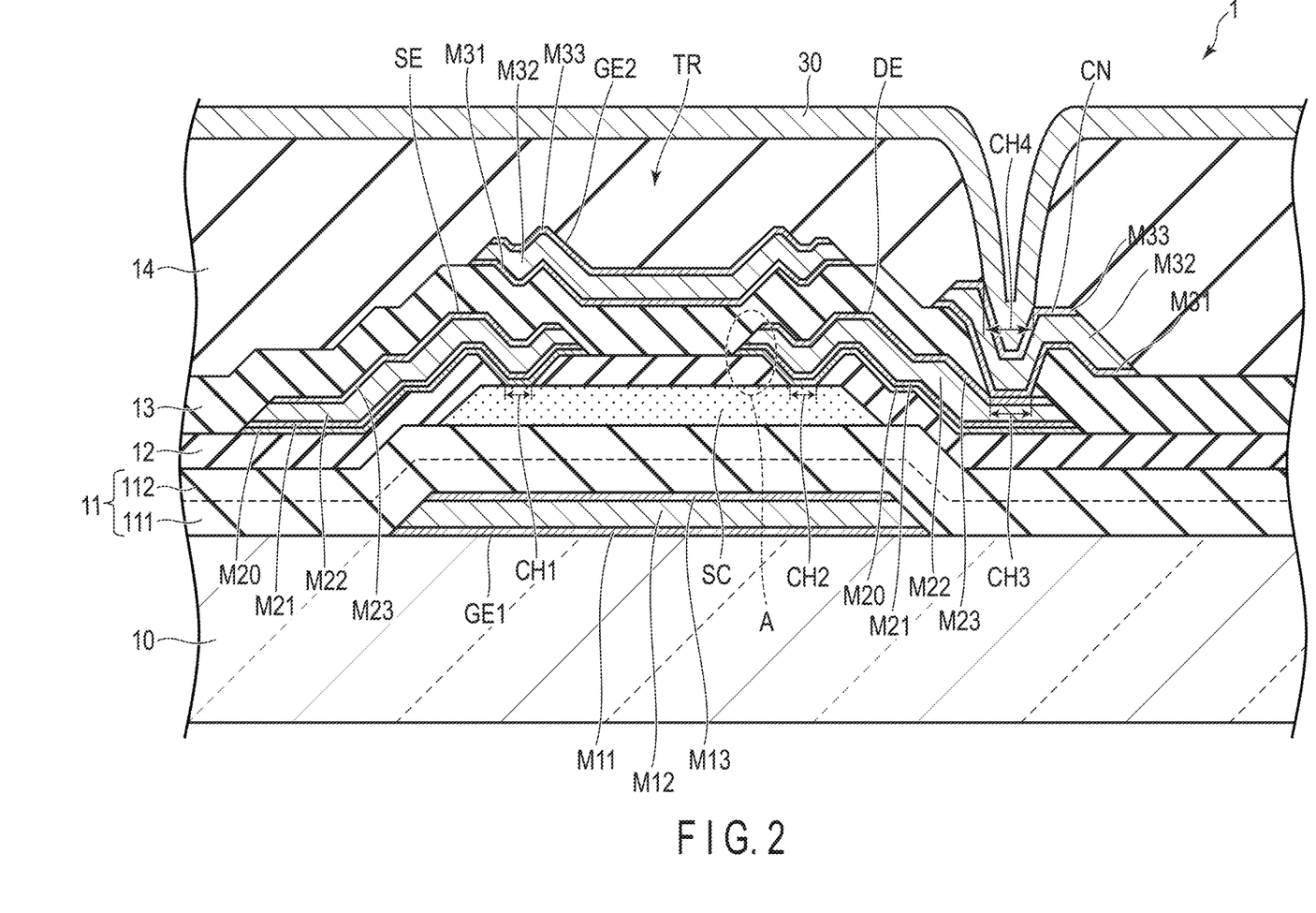
FIG. 2 is a cross-sectional view showing a configuration example of a semiconductor device 1 comprising a transistor TR.

FIG. 2 is a cross-sectional view showing a configuration example of a semiconductor device 1 comprising the transistor TR.

The semiconductor device 1 comprises an insulating substrate 10, insulating layers 11 to 14, a transistor TR and an element electrode 30.

The transistor TR comprises an oxide semiconductor SC, a gate electrode (bottom gate electrode) GE1, a source electrode SE, a drain electrode DE and a gate electrode (top gate electrode) GE2. The gate electrodes GE1 and GE2 are electrically connected to each other, and further, are electrically connected to the gate line GL shown in FIG. 1. It should be noted that the gate electrode GE2 may be omitted. The source electrode SE is electrically connected to the source line SL. The drain electrode DE is spaced apart from the source electrode SE, and is electrically connected to a connection electrode CN. The element electrode 30 is electrically connected to the connection electrode CN.

The insulating substrate 10 is formed of an insulating material such as glass or a resinous film. The gate electrode GE1 is provided on the insulating substrate 10.

The insulating layer (first insulating layer) 11 is an inorganic insulating layer, and is provided on the insulating substrate 10, and covers the gate electrode GE1. The insulating layer 11 is, for example, a stacked layer body of a silicon nitride layer 111 and a silicon oxide layer 112. The silicon nitride layer 111 directly covers the insulating substrate 10 and the gate electrode GE1. The silicon oxide layer 112 is directly stacked on the silicon nitride layer 111. For example, the thickness of the silicon oxide layer 112 is less than that of the silicon nitride layer 111. The insulating layer 11 may be a single-layer body of a silicon oxide layer.

The oxide semiconductor SC is located immediately above the gate electrode GE1, and is provided on the insulating layer 11.

The insulating layer (a second insulating layer or an etch stop layer) 12 is an inorganic insulating layer, and is provided on the insulating layer 11, and covers the oxide semiconductor SC. The insulating layer 12 comprises through-holes CH1 and CH2 which penetrate the insulating layer 12 such that the oxide semiconductor SC is exposed. The insulating layer 12 is a silicon oxide layer. In other words, the oxide semiconductor SC is in contact with the silicon oxide layer 112 of the insulating layer 11, and is in contact with the insulating layer 12 which is a silicon oxide layer.

The source electrode SE is provided on the insulating layer 12, and is in contact with the oxide semiconductor SC in the through-hole CH1. The drain electrode DE is provided on the insulating layer 12, and is in contact with the oxide semiconductor SC in the through-hole CH2. The source electrode SE and the drain electrode DE are located in the same layer, and are conductive layers formed of the same material.

The insulating layer (passivation film) 13 is an inorganic insulating layer, and is provided on the insulating layer 12, and covers the source electrode SE and the drain electrode DE. The insulating layer 13 is in contact with the insulating layer 12 between the source electrode SE and the drain electrode DE. The insulating layer 13 comprises a through-hole CH3 which penetrates the insulating layer 13 such that the drain electrode DE is exposed. The insulating layer 13 is, for example, a stacked layer body of a silicon nitride layer and a silicon oxide layer. However, the insulating layer 13 is not limited to this example, and may be a single-layer body of a silicon nitride layer.

The gate electrode GE2 is located immediately above the gate electrode GE1 and is provided on the insulating layer 13. The connection electrode CN is provided on the insulating layer 13, and is in contact with the drain electrode DE in the through-hole CH3. The gate electrode GE2 and the connection electrode CN are located in the same layer, and are conductive layers formed of the same material.

The insulating layer 14 is provided on the insulating layer 13, and covers the gate electrode GE2 and the connection electrode CN. The insulating layer 14 comprises a through-hole CH4 which penetrates the insulating layer 14 such that the connection electrode CN is exposed. The insulating layer 14 is, for example, a transparent organic insulating layer formed of acrylic or polyimide.

The element electrode 30 is provided on the insulating layer 14, and is in contact with the connection electrode CN in the through-hole CH4. The element electrode 30 constitutes, for example, the pixel electrode, bottom electrode, anode or cathode of various types of electronic devices. The element electrode 30 is, for example, a transparent electrode formed of a transparent conductive material such as indium tin oxide (ITO) or indium zinc oxide (IZO). The element electrode 30 may be a metal electrode formed of a metal material such as silver or aluminum. Alternatively, the element electrode 30 may be a stacked layer body of a transparent electrode and a metal electrode. For example, the element electrode 30 may be configured as a stacked layer body formed by stacking a transparent electrode, a metal electrode and a transparent electrode in order, or may be configured as a stacked layer body of three or more layers.

The gate electrode GE1 is a multilayer body comprising a first metal layer M11, a second metal layer M12 and a third metal layer M13. The first metal layer M11 is in contact with the insulating substrate 10. The second metal layer M12 is stacked on the first metal layer M11. The third metal layer M13 is stacked on the second metal layer M12.

The first metal layer M11 and the third metal layer M13 are formed of the same material. The second metal layer M12 is formed of a different material from the first metal layer M11. For example, the first metal layer M11 and the third metal layer M13 are layers containing molybdenum (Mo), and the second metal layer M12 is a layer containing aluminum (Al). In this specification, a layer containing molybdenum may be a layer formed of solely molybdenum, or may be a layer formed of a molybdenum alloy. A layer containing aluminum may be a layer formed of solely aluminum, or may be a layer formed of an aluminum alloy.

Each of the source electrode SE and the drain electrode DE is a multilayer body comprising an oxide conductive layer M20, a first metal layer M21, a second metal layer M22 and a third metal layer M23. The oxide conductive layer M20 is an underlayer of the first metal layer M21, and is in contact with the insulating layer 12 and the oxide semiconductor SC. The first metal layer M21 is stacked on the oxide conductive layer M20. The second metal layer M22 is stacked on the first metal layer M21. The third metal layer M23 is stacked on the second metal layer M22.

The first metal layer M21 and the third metal layer M23 are formed of the same material. The second metal layer M22 is formed of a different material from the first metal layer M21. For example, the oxide conductive layer M20 is formed of indium tin oxide (ITO). However, the oxide conductive layer M20 may be formed of another transparent conductive material such as indium zinc oxide (IZO). The first metal layer M21 and the third metal layer M23 are layers containing molybdenum (Mo), and the second metal layer M22 is a layer containing aluminum (Al).

Each of the gate electrode GE2 and the connection electrode CN is a multilayer body comprising a first metal layer M31, a second metal layer M32 and a third metal layer M33. The first metal layer M31 is in contact with the insulating layer 13. The second metal layer M32 is stacked on the first metal layer M31. The third metal layer M33 is stacked on the second metal layer M32.

The first metal layer M31 and the third metal layer M33 are formed of the same material. The second metal layer M32 is formed of a different material from the first metal layer M31. For example, the first metal layer M31 and the third metal layer M33 are layers containing molybdenum (Mo), and the second metal layer M32 is a layer containing aluminum (Al).

The above first metal layers M11, M21 and M31 and the above third metal layers M13, M23 and M33 may be replaced by layers containing titanium (Ti). Each of the gate electrode GE2 and the connection electrode CN may be a layer formed of solely molybdenum.

Figure 3:
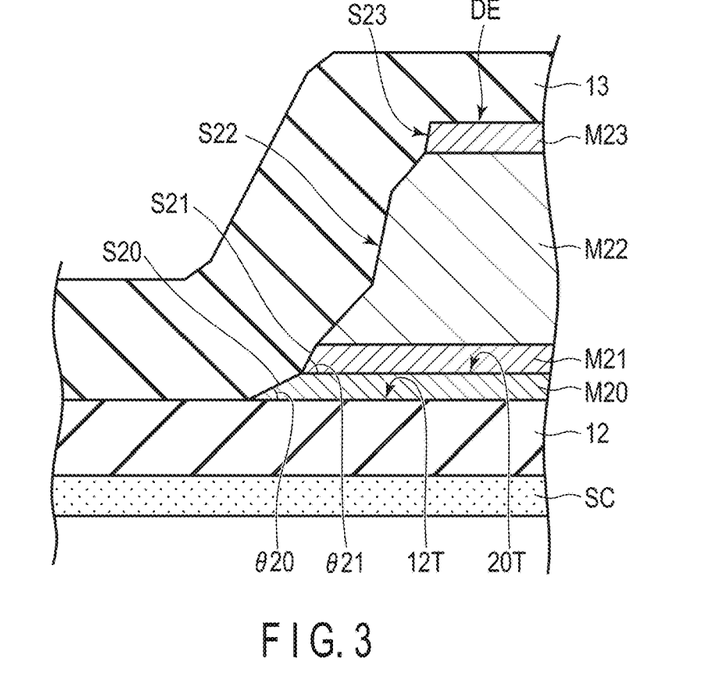
FIG. 3 is a cross-sectional view in which area A shown in FIG. 2 and including an end portion of a drain electrode DE is enlarged.

FIG. 3 is a cross-sectional view in which area A shown in FIG. 2 and including an end portion of the drain electrode DE is enlarged.

A side surface S22 of the second metal layer M22 is located on the external side relative to a side surface S23 of the third metal layer M23. A side surface S21 of the first metal layer M21 is located on the external side relative to the side surface S22 of the second metal layer M22. A side surface (first side surface) S20 of the oxide conductive layer M20 is located on the external side relative to the side surface (second side surface) S21 of the first metal layer M21.

The tilt θ20 of the side surface S20 relative to the upper surface 12T of the insulating layer 12 is less than the tilt θ21 of the side surface S21 relative to the upper surface 20T of the oxide conductive layer M20 (θ20<θ21).

This cross-sectional shape is formed in an end portion of the source electrode SE in addition to the end portion of the drain electrode DE.

For example, the drain electrode DE and the source electrode SE are formed as follows.

First, an ITO layer, a molybdenum layer, an aluminum layer and a molybdenum layer are formed on the insulating layer 12 in series. Subsequently, on the molybdenum layer, a photoresist having a predetermined shape is formed. Using this photoresist as a mask, the layers are immersed in an etching liquid (wet etching). When ITO, molybdenum and aluminum coexist in an etching liquid, the immersion potential of ITO is higher than that of molybdenum or aluminum. For this reason, the etching of molybdenum and aluminum is accelerated, and at the same time, the etching of ITO is suppressed. Because of this electrochemical mechanism, the electrode having a good tapered shape as shown in FIG. 3 can be reproducibly formed.

Subsequently, the insulating layer 13 is formed by a vapor deposition method. The insulating layer 13 is uniformly deposited on the side surfaces which constitute the drain electrode DE. Thus, the drain electrode DE can be assuredly covered with the insulating layer 13 without forming a crack or pinhole in the insulating layer 13. For the same reason, the source electrode SE can be assuredly covered with the insulating layer 13. In this way, the immersion of moisture via the insulating layer 13 is prevented, and the degradation of the performance of the transistor TR is prevented. Thus, reliability can be improved.

In the above semiconductor device 1, the other electrodes constituting the transistor TR, in other words, the gate electrodes GE1 and GE2 and the connection electrode CN, are stacked layer bodies of molybdenum/aluminum/molybdenum as described above. Thus, the other electrodes can be patterned by wet etching similar to that of the drain electrode DE.

Thus, the production costs can be reduced compared to a case where various types of electrodes are formed of a material which requires dry etching.

The insulating layer 12 which is an etch stop layer is interposed between the oxide semiconductor SC and the source electrode SE and between the oxide semiconductor SC and the drain electrode DE. Because of this configuration, the oxide semiconductor SC is hardly exposed to an etching liquid when the source electrode SE and the drain electrode DE are formed by wet etching. In this way, damage to the oxide semiconductor SC is prevented. In addition, the options of the materials of the oxide semiconductor SC can be broadened.

Each of the source electrode SE and the drain electrode DE comprises the oxide conductive layer M20 which is in contact with the oxide semiconductor SC. Thus, excessive extraction (metalation) of oxygen from the oxide semiconductor SC to the source electrode SE or the drain electrode DE is prevented compared to a case where a metal layer is directly in contact with the oxide semiconductor SC.

By this configuration, while the resistance of a source area which is in contact with the source electrode SE in the oxide semiconductor SC and a drain area which is in contact with the drain electrode DE in the oxide semiconductor SC is decreased, the expansion of the area in which the resistance is decreased is prevented. Therefore, in the above transistor TR having a bottom-gate structure, the reduction in the size is enabled so as to have a channel length equal to that of a transistor having a top-gate structure.

In the oxide semiconductor SC, a low-resistive area in which the resistance is higher than that of the source area and lower than that of the channel area is formed around the source area. Further, in the oxide semiconductor SC, a low-resistive area in which the resistance is higher than that of the drain area and lower than that of the channel area is formed around the drain area. These low-resistive areas ease the concentration of an electric field and prevent the generation of hot carriers. Thus, the shift of threshold voltage in which the transistor TR is changed from a non-conductive state to a conductive state is prevented, thereby improving reliability.

According to the investigation of the inventor, in view of the formation of the oxide conductive layer M20 having a uniform film thickness, the film thickness of the oxide conductive layer M20 should be preferably greater than or equal to 10 nm. In respect that the contact resistance of the oxide conductive layer M20 and the oxide semiconductor SC should be controlled so as to be within tolerance, the film thickness of the oxide conductive layer M20 should be preferably less than or equal to 50 nm.

Next, the inventor investigated the relationship between the channel length (L-length) of the transistor TR and threshold voltage (Vth).

Figure 4:
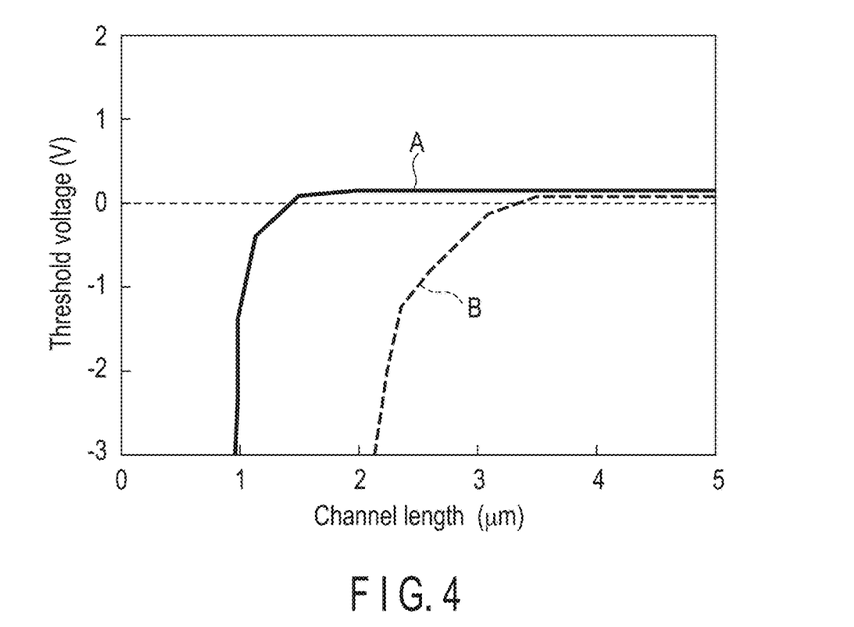
FIG. 4 shows the relationship of threshold voltage relative to the channel length of the transistor TR.

FIG. 4 shows the relationship of threshold voltage relative to the channel length of the transistor TR.

The horizontal axis of the figure shows channel length (μm), and the vertical axis of the figure shows threshold voltage (V). The inventor conducted an experiment for measuring threshold voltage regarding a plurality of transistors TR having different channel lengths. In the figure, "A" shows the experimental result of the transistors TR each explained with reference to FIG. 2. In the figure, "B" shows the experimental result of transistors each formed by omitting the oxide conductive layer M20 from the transistor TR explained with reference to FIG. 2.

The experiment confirmed the following matters. In a case where the oxide conductive layer M20 is not provided, when the channel length is less than 3.5 μm, an off-state leakage current is generated, and sufficient transistor performance cannot be obtained. In other words, to realize transistor performance without the oxide conductive layer M20, the channel length needs to be greater than or equal to 3.5 μm.

The experiment further confirmed the following matters. In a case where the oxide conductive layer M20 is provided, sufficient transistor performance can be realized when the channel length is greater than or equal to 1.5 μm. When the channel length is shortened in this manner, the size of the transistor can be reduced, and further, a higher on-state current can be obtained.

Now, this specification explains another configuration example of the transistor TR.

Figure 5:
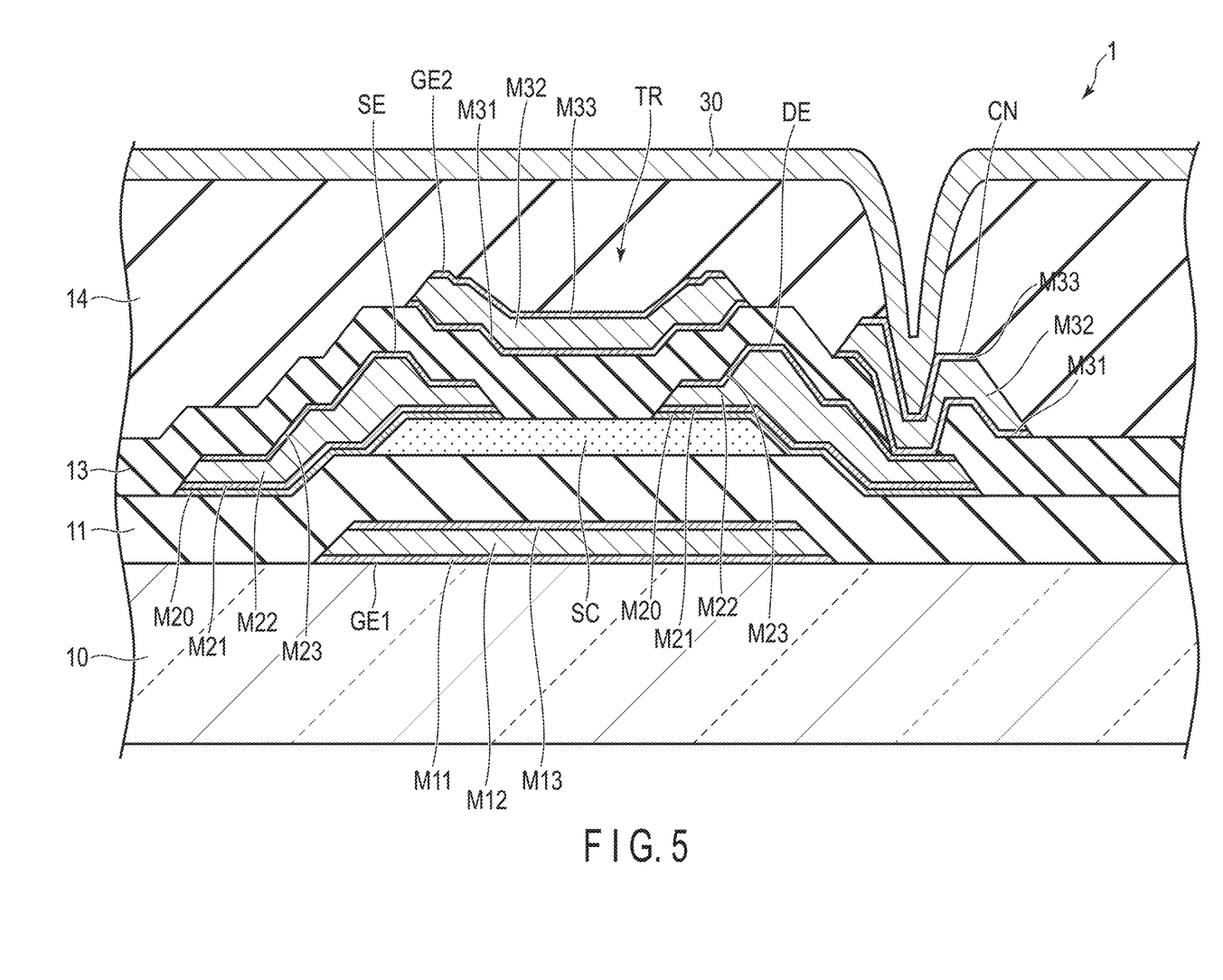
FIG. 5 is a cross-sectional view showing another configuration example of the semiconductor device 1 comprising the transistor TR.

FIG. 5 is a cross-sectional view showing another configuration example of the semiconductor device 1 comprising the transistor TR.

The configuration example shown in FIG. 5 is different from that of FIG. 2 in respect that the insulating layer 12 is omitted. As the other structural elements of the semiconductor device 1 are the same as the explanation of FIG. 2, the structural elements are denoted by like reference numbers, detailed description thereof being omitted.

The gate electrode GE1 is provided on the insulating substrate 10. The gate electrode GE1 is a multilayer body comprising the first metal layer M11, the second metal layer M12 and the third metal layer M13. For example, the first metal layer M11 and the third metal layer M13 are layers containing molybdenum (Mo), and the second metal layer M12 is a layer containing aluminum (Al).

The oxide semiconductor SC is located immediately above the gate electrode GE1, and is provided on the insulating layer 11.

The source electrode SE is provided on the insulating layer 11, and is in contact with the oxide semiconductor SC. The drain electrode DE is provided on the insulating layer 11, and is in contact with the oxide semiconductor SC. The source electrode SE and the drain electrode DE are located in the same layer, and are conductive layers formed of the same material.

Each of the source electrode SE and the drain electrode DE is a multilayer body comprising the oxide conductive layer M20, the first metal layer M21, the second metal layer M22 and the third metal layer M23. The oxide conductive layer M20 is in contact with the insulating layer 11 and the oxide semiconductor SC. For example, the oxide conductive layer M20 is formed of indium tin oxide (ITO). The first metal layer M21 and the third metal layer M23 are layers containing molybdenum (Mo), and the second metal layer M22 is a layer containing aluminum (Al).

The insulating layer (passivation film) 13 is an inorganic insulating layer, and is provided on the insulating layer 11, and covers the source electrode SE and the drain electrode DE. The insulating layer 13 is in contact with the oxide semiconductor SC between the source electrode SE and the drain electrode DE.

Each of the gate electrode GE2 and the connection electrode CN is a multilayer body comprising the first metal layer M31, the second metal layer M32 and the third metal layer M33. For example, the first metal layer M31 and the third metal layer M33 are layers containing molybdenum (Mo), and the second metal layer M32 is a layer containing aluminum (Al).

The above first metal layers M11, M21 and M31 and the above third metal layers M13, M23 and M33 may be replaced by layers containing titanium (Ti). Each of the gate electrode GE2 and the connection electrode CN may be a layer formed of solely molybdenum. The gate electrode GE2 may be omitted.

In this configuration example, similarly, as the insulating layer 13 is uniformly deposited on the side surfaces which constitute the source electrode SE and the drain electrode DE, immersion of moisture via the insulating layer 13 is prevented.

Since each of the source electrode SE and the drain electrode DE comprises the oxide conductive layer M20 which is in contact with the oxide semiconductor SC, excessive extraction (metalation) of oxygen from the oxide semiconductor SC to the source electrode SE or the drain electrode DE is prevented. By this configuration, in the above transistor TR having a bottom-gate structure, the reduction in the size is enabled so as to have a channel length equal to that of a transistor having a top-gate structure.

In the configuration example explained here, the etch stop layer is omitted. Thus, the oxide semiconductor layer SC is formed of a material having high tolerance relative to an etching liquid used when the source electrode SE and the drain electrode DE are etched. In this way, all of the gate electrodes GE1 and GE2, the source electrode SE, the drain electrode DE and the connection electrode CN can be pattered by wet etching. The production costs can be reduced compared to a case where various types of electrodes are formed of a material which requires dry etching.

Figure 6:
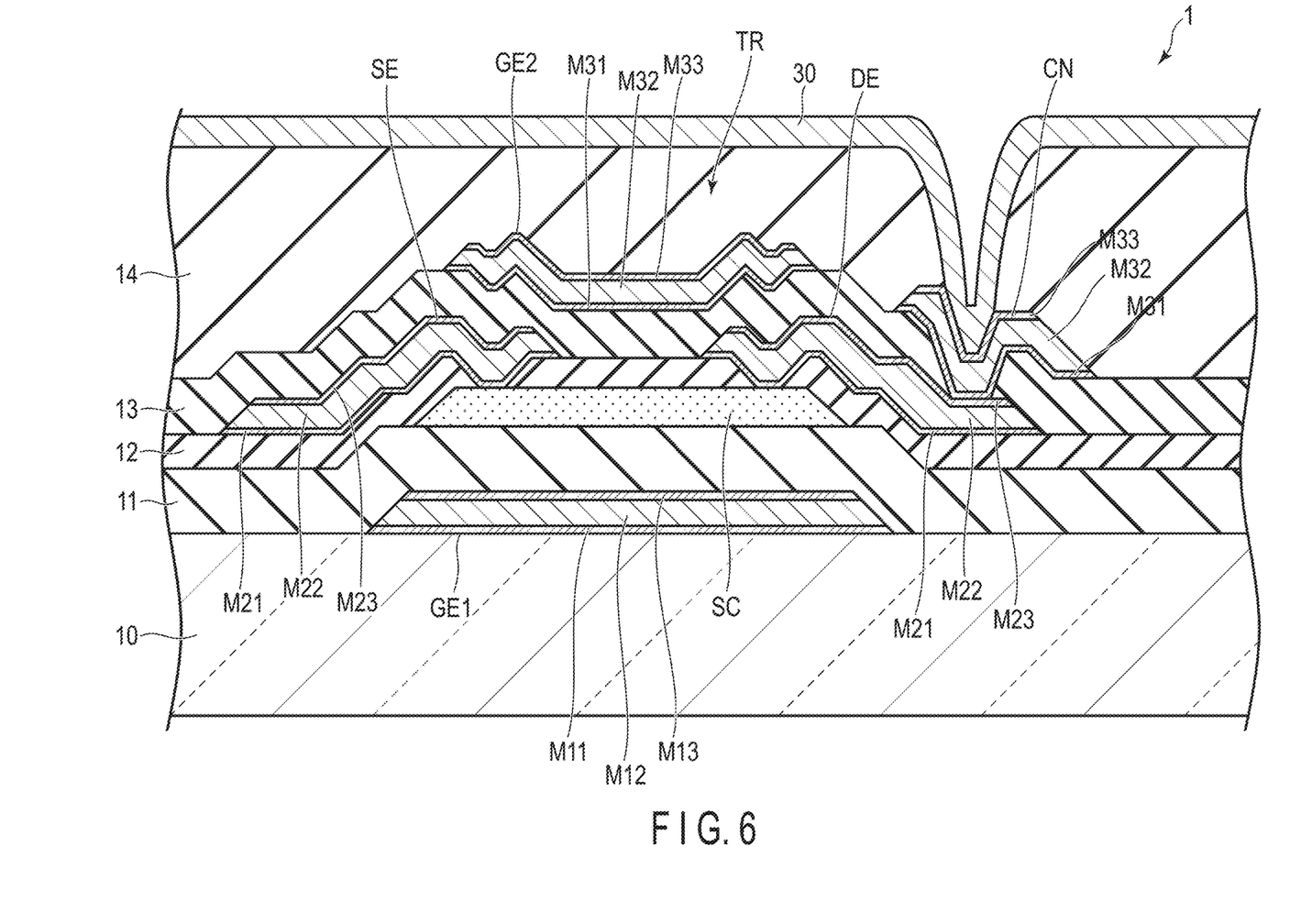
FIG. 6 is a cross-sectional view showing another configuration example of the semiconductor device 1 comprising the transistor TR.

FIG. 6 is a cross-sectional view showing another configuration example of the semiconductor device 1 comprising the transistor TR.

The configuration example shown in FIG. 6 is different from that of FIG. 2 in respect that the oxide conductive layers are omitted from the source electrode SE and the drain electrode DE. As the other structural elements of the semiconductor device 1 are the same as the explanation of FIG. 2, the structural elements are denoted by like reference numbers, detailed description thereof being omitted.

Each of the source electrode SE and the drain electrode DE is a multilayer body comprising the first metal layer M21, the second metal layer M22 and the third metal layer M23. The first metal layer M21 is in contact with the insulating layer 12 and the oxide semiconductor SC. For example, the first metal layer M21 and the third metal layer M23 are layers containing molybdenum (Mo), and the second metal layer M22 is a layer containing aluminum (Al).

The gate electrode GE1 is a multilayer body comprising the first metal layer M11, the second metal layer M12 and the third metal layer M13. For example, the first metal layer M11 and the third metal layer M13 are layers containing molybdenum (Mo), and the second metal layer M12 is a layer containing aluminum (Al).

Each of the gate electrode GE2 and the connection electrode CN is a multilayer body comprising the first metal layer M31, the second metal layer M32 and the third metal layer M33. For example, the first metal layer M31 and the third metal layer M33 are layers containing molybdenum (Mo), and the second metal layer M32 is a layer containing aluminum (Al).

The above first metal layers M11, M21 and M31 and the above third metal layers M13, M23 and M33 may be replaced by layers containing titanium (Ti). Each of the gate electrode GE2 and the connection electrode CN may be a layer formed of solely molybdenum. The gate electrode GE2 may be omitted.

In this configuration example, similarly, all of the gate electrodes GE1 and GE2, the source electrode SE, the drain electrode DE and the connection electrode CN can be pattered by wet etching. The production costs can be reduced compared to a case where various types of electrodes are formed of a material which requires dry etching.

The insulating layer 12 which is an etch stop layer is interposed between the oxide semiconductor SC and the source electrode SE and between the oxide semiconductor SC and the drain electrode DE. Because of this configuration, the oxide semiconductor SC is hardly exposed to an etching liquid used when the source electrode SE and the drain electrode DE are formed by wet etching. In this way, damage to the oxide semiconductor SC is prevented. In addition, the options of the materials of the oxide semiconductor SC can be broadened.

In the oxide semiconductor SC, a low-resistive area in which the resistance is lower than that of the channel area is formed around the source area and the drain area. In this low-resistive area, even if high voltage is applied between the source electrode and the drain electrode, the generation of hot carriers is prevented. Thus, the shift of threshold voltage is prevented, thereby improving reliability.

Figure 7:
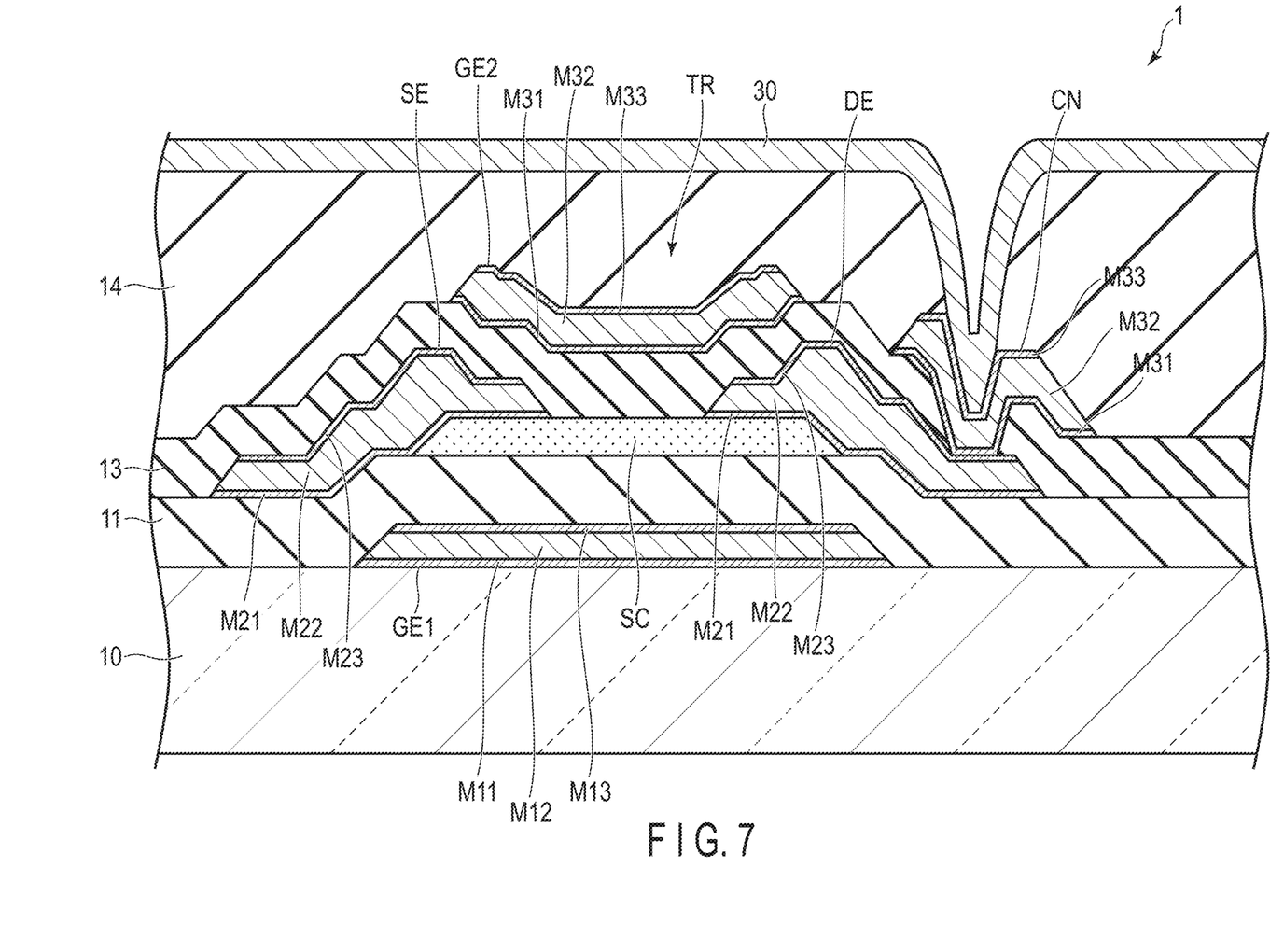
FIG. 7 is a cross-sectional view showing another configuration example of the semiconductor device 1 comprising the transistor TR.

FIG. 7 is a cross-sectional view showing another configuration example of the semiconductor device 1 comprising the transistor TR.

The configuration example shown in FIG. 7 is different from that of FIG. 5 in respect that the oxide conductive layers are omitted from the source electrode SE and the drain electrode DE. As the other structural elements of the semiconductor device 1 are the same as the explanation of FIG. 2, the structural elements are denoted by like reference numbers, detailed description thereof being omitted.

Each of the source electrode SE and the drain electrode DE is a multilayer body comprising the first metal layer M21, the second metal layer M22 and the third metal layer M23. The first metal layer M21 is in contact with the insulating layer 11 and the oxide semiconductor SC. For example, the first metal layer M21 and the third metal layer M23 are layers containing molybdenum (Mo), and the second metal layer M22 is a layer containing aluminum (Al).

The gate electrode GE1 is a multilayer body comprising the first metal layer M11, the second metal layer M12 and the third metal layer M13. For example, the first metal layer M11 and the third metal layer M13 are layers containing molybdenum (Mo), and the second metal layer M12 is a layer containing aluminum (Al).

Each of the gate electrode GE2 and the connection electrode CN is a multilayer body comprising the first metal layer M31, the second metal layer M32 and the third metal layer M33. For example, the first metal layer M31 and the third metal layer M33 are layers containing molybdenum (Mo), and the second metal layer M32 is a layer containing aluminum (Al).

The above first metal layers M11, M21 and M31 and the above third metal layers M13, M23 and M33 may be replaced by layers containing titanium (Ti). Each of the gate electrode GE2 and the connection electrode CN may be a layer formed of solely molybdenum. The gate electrode GE2 may be omitted.

In the configuration example explained here, the etch stop layer is omitted. Thus, the oxide semiconductor layer SC is formed of a material having high tolerance relative to an etching liquid used when the source electrode SE and the drain electrode DE are etched. In this way, all of the gate electrodes GE1 and GE2, the source electrode SE, the drain electrode DE and the connection electrode CN can be pattered by wet etching. The production costs can be reduced compared to a case where various types of electrodes are formed of a material which requires dry etching.

The transistor TR of each of the configuration examples shown in FIG. 2 and FIG. 6 can obtain high withstand voltage characteristics regarding high voltage which may be applied between the source electrode and the drain electrode. As an example, a stress test was conducted. In the test, the application voltage of the gate electrode GE1 was set to 40 V, and the application voltage between the source electrode SE and the drain electrode DE was set to ±30 V. In this condition, voltage was continuously applied for 1000 seconds in an environment of 60° C. As a result of the stress test, it was confirmed that threshold voltage hardly shifted. Thus, the transistor TR of each of the configuration examples shown in FIG. 2 and FIG. 6 can be applied to a semiconductor device to which high voltage may be applied.

In comparison with the transistor TR shown in FIG. 2 and FIG. 6, the transistor TR of each of the configuration examples shown in FIG. 5 and FIG. 7 has low withstand voltage characteristics. However, the transistor TR of each of the configuration examples shown in FIG. 5 and FIG. 7 can be applied to a semiconductor device which is driven by comparatively low voltage such as a liquid crystal display device.

Figure 8:
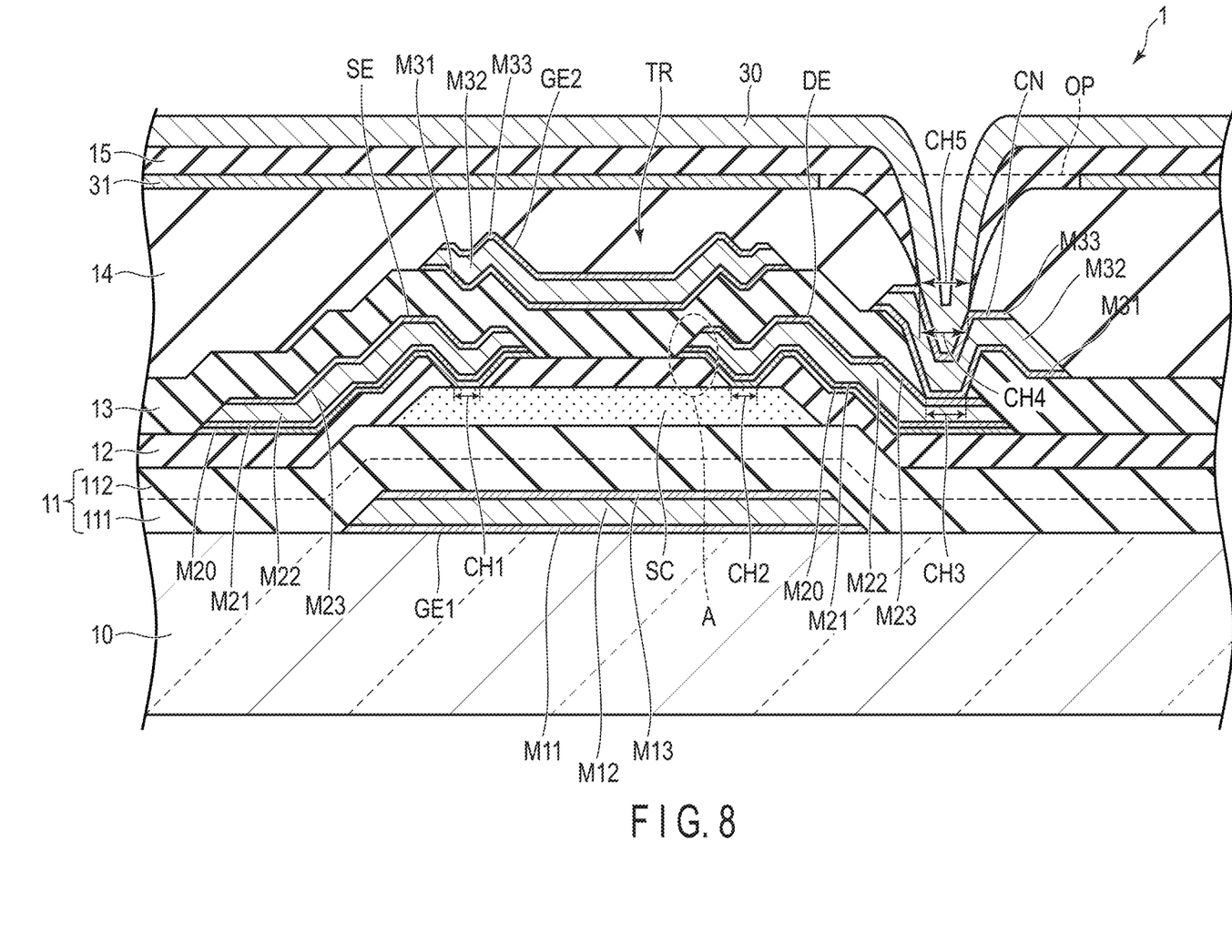
FIG. 8 is a cross-sectional view showing another configuration example of the semiconductor device 1 comprising the transistor TR.

FIG. 8 is a cross-sectional view showing another configuration example of the semiconductor device 1 comprising the transistor TR.

The configuration example shown in FIG. 8 is different from that of FIG. 2 in respect that the semiconductor device 1 further comprises a common electrode 31 and an insulating layer 15.

The common electrode 31 is provided on the insulating layer 14. For example, the common electrode 31 also functions as the capacitive lines CW and the common electrode CE shown in FIG. 1, and is provided over the pixels PX of the display area DA. In each pixel PX, the common electrode 31 overlaps the transistor TR. The common electrode 31 comprises an opening OP. The opening OP is formed so as to overlap the through-hole CH4. This common electrode 31 is, for example, a transparent electrode formed of a transparent conductive material such as ITO or IZO.

The insulating layer 15 is an inorganic insulating layer, and is provided on the insulating layer 14, and covers the common electrode 31. In the opening OP, the insulating layer 15 comprises a through-hole CH5 which penetrates the insulating layer 15 such that the connection electrode CN is exposed. The insulating layer 15 is, for example, a silicon nitride layer.

The element electrode 30 is provided on the insulating layer 15, and is in contact with the connection electrode CN in the through-holes CH4 and CH5. The element electrode 30 faces the common electrode 31 via the insulating layer 15. The element electrode 30 is, for example, the pixel electrode provided in each pixel PX.

As the other structural elements of the semiconductor device 1 are the same as the explanation of FIG. 2, the structural elements are denoted by like reference numbers, detailed description thereof being omitted.

In this configuration example, an effect similar to that of the configuration example shown in FIG. 2 can be obtained.

Here, as a modification of the configuration example of FIG. 2, a configuration example in which the common electrode 31 and the insulating layer 15 are added is explained. In each of the configuration examples shown in FIG. 5 to FIG. 7, similarly, the common electrode 31 and the insulating layer 15 shown in FIG. 8 may be added.

As explained above, according to the present embodiment, it is possible to provide a semiconductor device in which the size of a transistor can be reduced.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

What is claimed is:

1. A semiconductor device comprising:
an insulating substrate;
a gate electrode provided on the insulating substrate;
a first insulating layer covering the gate electrode;
an oxide semiconductor provided on the first insulating layer immediately above the gate electrode;
a source electrode in contact with the oxide semiconductor; and
a drain electrode in contact with the oxide semiconductor, wherein
each of the source electrode and the drain electrode comprises:
an oxide conductive layer in contact with the oxide semiconductor;
a first metal layer stacked on the oxide conductive layer;
a second metal layer formed of a different material from the first metal layer, and stacked on the first metal layer; and
a third metal layer formed of a same material as the first metal layer, and stacked on the second metal layer, and
a first side surface of the oxide conductive layer is located on an external side relative to a second side surface of the first metal layer, and
a tilt of the first side surface is less than a tilt of the second side surface.

2. The semiconductor device of claim 1, wherein
the oxide conductive layer is formed of indium tin oxide or indium zinc oxide.

3. The semiconductor device of claim 1, wherein
the first metal layer and the third metal layer are formed of a material containing molybdenum (Mo), and
the second metal layer is formed of a material containing aluminum (Al).

4. The semiconductor device of claim 1, further comprising a passivation film covering the source electrode and the drain electrode, wherein
the oxide conductive layer is in contact with the first insulating layer and the oxide semiconductor, and
the passivation film is in contact with the oxide semiconductor between the source electrode and the drain electrode.

5. A semiconductor device comprising:
an insulating substrate;
a gate electrode provided on the insulating substrate;
a first insulating layer covering the gate electrode;
an oxide semiconductor provided on the first insulating layer immediately above the gate electrode;
a source electrode in contact with the oxide semiconductor;
a drain electrode in contact with the oxide semiconductor;
a second insulating layer covering the oxide semiconductor; and
a passivation film covering the source electrode and the drain electrode, wherein
each of the source electrode and the drain electrode comprises:
an oxide conductive layer in contact with the oxide semiconductor;
a first metal layer stacked on the oxide conductive layer;
a second metal layer formed of a different material from the first metal layer, and stacked on the first metal layer; and
a third metal layer formed of a same material as the first metal layer, and stacked on the second metal layer, and
the oxide conductive layer is in contact with the second insulating layer, and is in contact with the oxide semiconductor in a through-hole of the second insulating layer, and the passivation film is in contact with the second insulating layer between the source electrode and the drain electrode.

6. A semiconductor device comprising:
an insulating substrate;
a gate electrode provided on the insulating substrate;
a first insulating layer covering the gate electrode;
an oxide semiconductor provided on the first insulating layer immediately above the gate electrode;
a source electrode in contact with the oxide semiconductor;
a drain electrode in contact with the oxide semiconductor;
a passivation film covering the source electrode and the drain electrode; and
a top gate electrode provided on the passivation film and electrically connected to the gate electrode immediately above the gate electrode, wherein
each of the gate electrode, the source electrode, the drain electrode and the top gate electrode comprises:
a first metal layer containing molybdenum (Mo);
a second metal layer containing aluminum (Al) and stacked on the first metal layer; and
a third metal layer containing molybdenum (Mo) and stacked on the second metal layer.

7. The semiconductor device of claim 6, wherein
each of the source electrode and the drain electrode comprises, as an underlayer of the first metal layer, an oxide conductive layer in contact with the oxide semiconductor.

8. The semiconductor device of claim 6, further comprising a second insulating layer covering the oxide semiconductor, wherein
the passivation film is in contact with the second insulating layer between the source electrode and the drain electrode.

9. The semiconductor device of claim 6, wherein
the passivation film is in contact with the oxide semiconductor between the source electrode and the drain electrode.

* * * * *